(12) United States Patent
Sexton et al.

(10) Patent No.: US 8,252,140 B2
(45) Date of Patent: Aug. 28, 2012

(54) PLASMA CHAMBER FOR WAFER BEVEL EDGE PROCESSING

(75) Inventors: Gregory S. Sexton, Fremont, CA (US); Andrew D. Bailey, III, Pleasanton, CA (US); Andras Kuthi, Thousand Oaks, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/084,849

(22) Filed: Apr. 12, 2011

(65) Prior Publication Data

US 2011/0186227 A1 Aug. 4, 2011

Related U.S. Application Data

(60) Division of application No. 11/758,576, filed on Jun. 5, 2007, now Pat. No. 7,938,931, which is a continuation-in-part of application No. 11/440,561, filed on May 24, 2006, now Pat. No. 7,909,960.

(60) Provisional application No. 60/893,074, filed on Mar. 5, 2007, provisional application No. 60/893,069, filed on Mar. 5, 2007.

(51) Int. Cl.
*C23F 1/00* (2006.01)
*H01L 21/306* (2006.01)

(52) U.S. Cl. ................................... 156/345.3
(58) Field of Classification Search ............... 156/345.3
See application file for complete search history.

(56) References Cited

U.S. PATENT DOCUMENTS

| | | | |
|---|---|---|---|
| 2002/0022281 A1* | 2/2002 | Flanner et al. | 438/8 |
| 2004/0137745 A1* | 7/2004 | Houghton et al. | 438/706 |
| 2004/0238488 A1* | 12/2004 | Choi et al. | 216/58 |
| 2005/0173067 A1* | 8/2005 | Lim | 156/345.32 |
| 2005/0178505 A1* | 8/2005 | Kim | 156/345.47 |

FOREIGN PATENT DOCUMENTS

| | | | |
|---|---|---|---|
| JP | 07-142449 | * | 6/1995 |
| WO | WO2004-100247 | * | 11/2004 |

OTHER PUBLICATIONS

English translation of JP 07-142449, Masuda, Jun. 1995.*

* cited by examiner

*Primary Examiner* — Keath Chen
(74) *Attorney, Agent, or Firm* — Martine Penilla Group, LLP

(57) ABSTRACT

The embodiments provide structures and mechanisms for removal of etch byproducts, dielectric films and metal films on and near the substrate bevel edge, and chamber interior to avoid the accumulation of polymer byproduct and deposited films and to improve process yield. In one example, a chamber for wafer bevel edge cleaning is provided. The chamber includes a bottom electrode having a bottom electrode surface for supporting the wafer when present. Also included is a top edge electrode surrounding an insulating plate. The insulator plate is opposing the bottom electrode. The top edge electrode is electrically grounded and has a down-facing L shape. Further included in the chamber is a bottom edge electrode that is electrically grounded and spaced apart from the bottom electrode. The bottom edge electrode is disposed to encircle the bottom electrode. The bottom edge electrode is oriented to oppose the down-facing L shape of the top edge electrode.

13 Claims, 11 Drawing Sheets

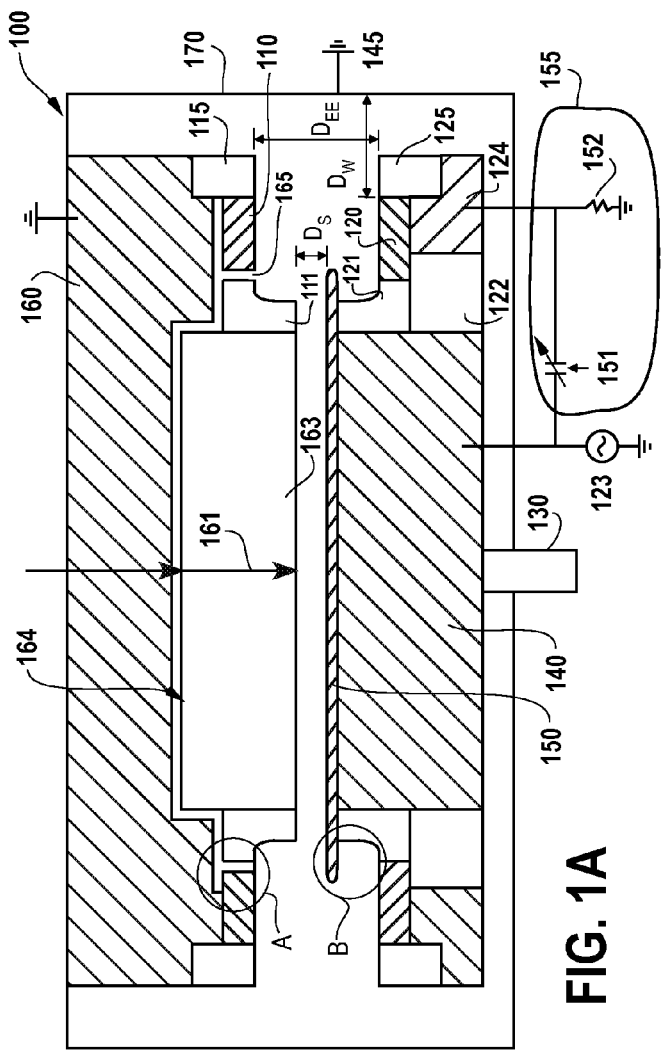
FIG. 1A
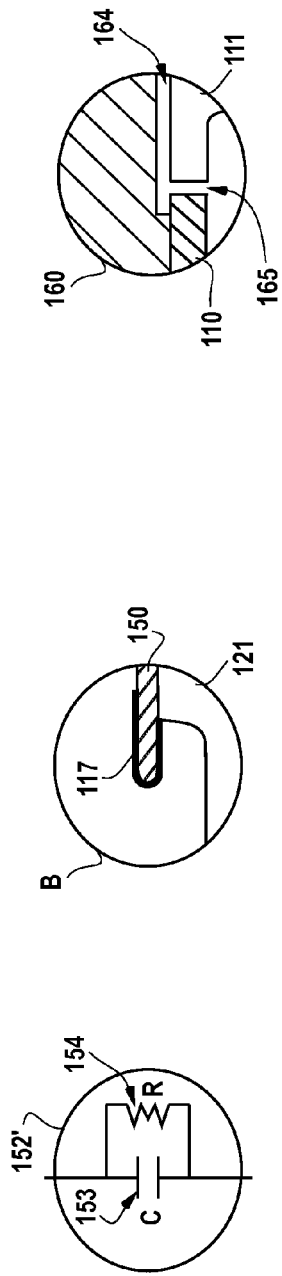
FIG. 1C
FIG. 1B
FIG. 1A-1

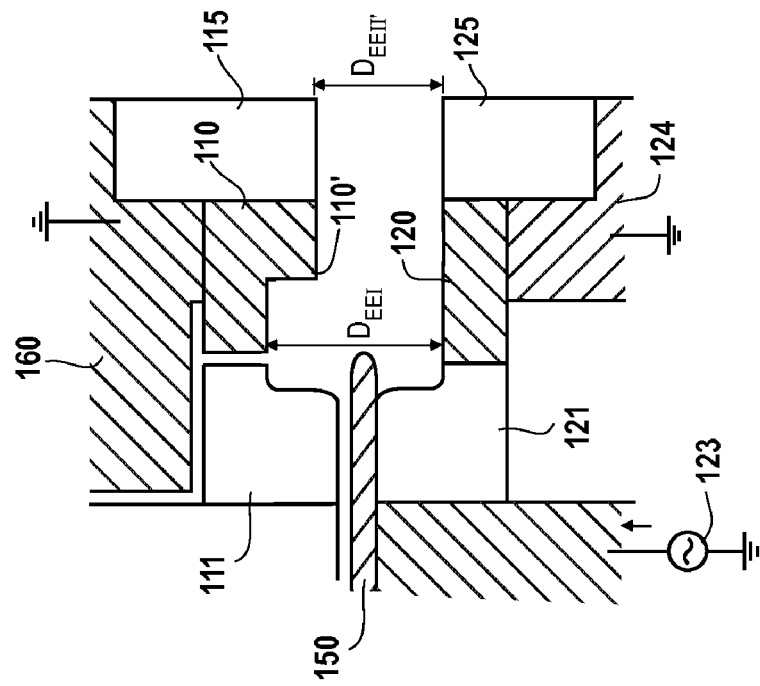
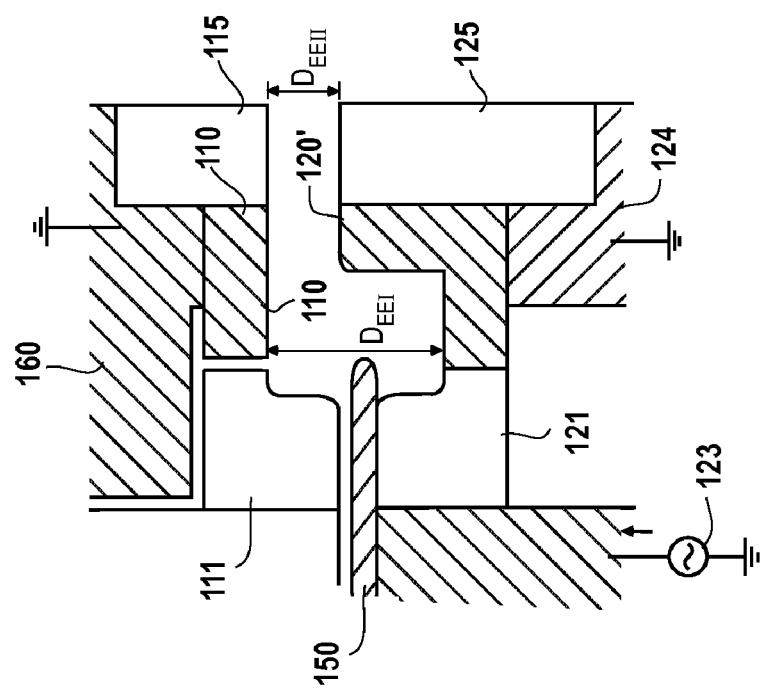

PLASMA CHAMBER FOR WAFER BEVEL EDGE PROCESSING

CLAIM OF PRIORITY

This application is a divisional application of U.S. patent application Ser. No. 11/758,576, filed Jun. 5, 2007, now U.S. Pat. No. 7,938,931, and entitled "Edge Electrodes with Variable Power," and which is a continuation-in-part of U.S. patent application Ser. No. 11/440,561 filed on May 24, 2006, now U.S. Pat. No. 7,909,960, and titled "Apparatus and Methods to Remove Films on Bevel Edge and Backside of Wafer," which claims the priority of U.S. Provisional Application No. 60/893,074, filed on Mar. 5, 2007, and titled "Edge Electrodes with Dielectric Covers," and U.S. Provisional application No. 60/893,069, filed on Mar. 5, 2007, and titled "Edge Electrodes with Variable Power." These applications are incorporated herein by reference in their entireties for all purposes.

CROSS REFERENCE TO RELATED APPLICATIONS

This application is related to: (1) U.S. patent application Ser. No. 11/758,584, filed on Jun. 5, 2007, and entitled "EDGE ELECTRODES WITH DIELECTRIC COVERS", and (2) U.S. patent application Ser. No. 11/704,870, filed on Feb. 8, 2007 and entitled "METHODS OF AND APPARATUS FOR ALIGNING ELECTRODES IN A PROCESS CHAMBER TO PROTECT AN EXCLUSION AREA WITHIN AN EDGE ENVIRON OF A WAFER", both of which are incorporated herein by reference.

This application is also related to: (3) U.S. patent application Ser. No. 11/701,854, filed on Feb. 2, 2007 and entitled "APPARATUS FOR DEFINING REGIONS OF PROCESS EXCLUSION AND PROCESS PERFORMANCE IN A PROCESS CHAMBER"; and (4) U.S. patent application Ser. No. 11/697,695, filed on Apr. 6, 2007 and entitled "METHOD AND SYSTEM FOR DISTRIBUTING GAS FOR A BEVEL EDGE ETCHER", both of which are incorporated herein by reference.

BACKGROUND

The present invention relates in general to substrate manufacturing technologies and in particular to apparatus and methods for the removal etch byproducts from a bevel edge of a substrate.

In the processing of a substrate, e.g., a semiconductor substrate (or wafer) or a glass panel such as one used in flat panel display manufacturing, plasma is often employed. During substrate processing, the substrate (or wafer) is divided into a plurality of dies of square or rectangular shapes. Each of the plurality of dies will become an integrated circuit. The substrate is then processed in a series of steps in which materials are selectively removed (or etched) and deposited. Control of the transistor gate critical dimension (CD) on the order of a few nanometers is a top priority, as each nanometer deviation from the target gate length may translate directly into the operational speed and/or operability of these devices.

Typically, a substrate is coated with a thin film of hardened emulsion (such as a photoresist mask) prior to etching. Areas of the hardened emulsion are then selectively removed, causing parts of the underlying layer to become exposed. The substrate is then placed on a substrate support structure in a plasma processing chamber. An appropriate set of plasma gases is then introduced into the chamber and a plasma is generated to etch exposed areas of the substrate.

During an etch process, etch byproducts, for example polymers composed of Carbon (C), Oxygen (O), Nitrogen (N), Fluorine (F), etc., are often formed on the top and the bottom surfaces near a substrate edge (or bevel edge). Etch plasma density is normally lower near the edge of the substrate, which results in accumulation of polymer byproducts on the top and and on the bottom surfaces of the substrate bevel edge. Typically, there are no dies present near the edge of the substrate, for example between about 5 mm to about 15 mm from the substrate edge. However, as successive byproduct polymer layers are deposited on the top and bottom surfaces of the bevel edge as a result of several different etch processes, organic bonds that are normally strong and adhesive will eventually weaken during subsequent processing steps. The polymer layers formed near the top and bottom surfaces of a substrate edge would then peel or flake off, often onto another substrate during substrate transport. For example, substrates are commonly moved in sets between plasma processing systems via substantially clean containers, often called cassettes. As a higher positioned substrate is repositioned in the container, byproduct particles (or flakes) may fall on a lower substrate where dies are present, potentially affecting device yield.

Dielectric films, such as SiN and $SiO_2$, and metal films, such as Al and Cu, can also be deposited on the bevel edge (including the top and bottom surfaces) and do not get removed during etching processes. These films can also accumulate and flake off during subsequent processing steps, thereby impacting device yield. In addition, the interior of the process chamber, such as chamber walls, can also accumulate etch byproduct polymers, which needs to be removed periodically to avoid byproducts accumulation and chamber particle issues.

In view of the foregoing, there is a need for apparatus and methods that provide improved mechanisms of removal of etch byproducts, dielectric films and metal films near the substrate bevel edge, and chamber interior to avoid accumulation of polymer byproducts and deposited films and to improve process yield.

SUMMARY

Broadly speaking, the disclosed embodiments fill the need by providing structures and mechanisms of removal of etch byproducts, dielectric films and metal films near the substrate bevel edge, and chamber interior, to avoid the accumulation of polymer byproduct and deposited films and to improve process yield. It should be appreciated that the present invention can be implemented in numerous ways, including as a process, an apparatus, or a system. Several inventive embodiments of the present invention are described below.

In one example, a chamber for wafer bevel edge cleaning is provided. The chamber includes a bottom electrode having a bottom electrode surface for supporting the wafer when present. Also included is a top edge electrode surrounding an insulating plate. The insulator plate is opposing the bottom electrode. The top edge electrode is electrically grounded and has a down-facing L shape. Further included in the chamber is a bottom edge electrode that is electrically grounded and spaced apart from the bottom electrode. The bottom edge electrode is disposed to encircle the bottom electrode. The bottom edge electrode is oriented to oppose the down-facing L shape of the top edge electrode.

In one embodiment, a plasma processing chamber configured to clean a bevel edge of a substrate is provided. The plasma processing chamber includes a bottom electrode configured to receive the substrate, wherein the bottom electrode is coupled to a radio frequency (RF) power supply. The plasma processing chamber also includes a top edge electrode surrounding an insulating plate opposing the bottom electrode. The top edge electrode is electrically grounded. The plasma processing chamber further includes a bottom edge electrode surrounding the bottom electrode. The bottom edge electrode opposes the top edge electrode. The top edge electrode, the substrate disposed on the bottom electrode, and the bottom edge electrode are configured to generate a cleaning plasma to clean the bevel edge of the substrate. The bottom edge electrode and the bottom electrode are electrically coupled to one another through an RF circuit tunable to adjust the amount of RF current going between the substrate disposed on the bottom electrode, the bottom edge electrode and the top edge electrode.

In another embodiment, a method of cleaning a bevel edge of a substrate in a processing chamber is provided. The method includes placing a substrate on a bottom electrode in the processing chamber, wherein the bottom electrode is coupled to a radio frequency (RF) power supply. The method also includes flowing a cleaning gas into the processing chamber. The method further includes generating a cleaning plasma near the bevel edge of the substrate to clean the bevel edge by powering the bottom electrode with a RF power supply and by grounding a top edge electrode. The processing chamber has a top edge electrode surrounding an insulating plate opposing the bottom electrode. The top edge electrode is electrically grounded. A bottom edge electrode surrounds the bottom electrode, and opposes the top edge electrode. The top edge electrode, the substrate disposed on the bottom electrode, and the bottom edge electrode are configured to generate the cleaning plasma. The bottom edge electrode and the bottom electrode are electrically coupled to one another through an RF circuit tunable to adjust the amount of RF current going between the substrate disposed In another embodiment, a plasma processing chamber configured to clean a bevel edge of a substrate is provided. The plasma processing chamber includes a bottom electrode configured to receive the substrate. The bottom electrode is configured to lift up the substrate by a plurality of lift pins and the bottom electrode is coupled to a radio frequency (RF) power supply. The plasma processing chamber also includes a bottom edge electrode surrounding the bottom electrode. The bottom edge electrode and the bottom electrode is electrically isolated from one another by a bottom dielectric ring, the bottom edge electrode being electrically coupled to the bottom electrode through an RF circuit. The RF circuit includes a resistor and a tunable capacitor between the bottom electrode and the bottom edge electrode, one end of the resistor being placed between the bottom edge electrode and the tunable capacitor, and the other end of the resistor being grounded. The plasma processing chamber further includes a top edge electrode surrounding an insulator plate opposing the bottom electrode. The top edge electrode is electrically grounded. The top edge electrode and the bottom edge electrode opposes one another. The top edge electrode, the bottom electrode, and the bottom edge electrode are configured to generate a cleaning plasma to clean the bevel edge of the substrate.

In yet another embodiment, a plasma processing chamber configured to clean a bevel edge of a substrate is provided. The plasma processing chamber includes a bottom electrode configured to receive the substrate. The bottom electrode is coupled to a radio frequency (RF) power supply. The plasma processing chamber also includes a top edge electrode surrounding an insulating plate opposing the bottom electrode. The top edge electrode is electrically grounded. The plasma processing chamber further includes a bottom edge electrode surrounding the bottom electrode. The bottom edge electrode opposes the top edge electrode. The bottom edge electrode has a L-shaped cross section with an end of the bottom edge electrode closer to the bottom electrode thinner than an opposite end. The top edge electrode, the substrate disposed on the bottom electrode, and the bottom edge electrode are configured to generate a cleaning plasma to clean the bevel edge of the substrate. The bottom edge electrode and the bottom electrode are electrically coupled to one another through an RF circuit tunable to adjust the amount of RF current going between the substrate disposed Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 1A shows a schematic diagram of a substrate etching system with a pair of top and bottom edge electrodes, in accordance with one embodiment of the present invention.

FIG. 1A-1 shows another embodiment replacing resistor 152, in accordance with an embodiment of the present invention.

FIG. 1B shows an enlarged region B of FIG. 1A, in accordance with one embodiment of the present invention.

FIG. 1C shows an enlarged region A of FIG. 1A, in accordance with one embodiment of the present invention.

FIG. 4A shows a part of a processing chamber to clean bevel edge cleaning similar to FIG. 1E, in accordance with one embodiment of the present invention.

FIG. 4B shows a part of a processing chamber to clean bevel edge cleaning similar to FIG. 1E, in accordance with another embodiment of the present invention.

DETAILED DESCRIPTION OF THE EXEMPLARY EMBODIMENTS

Figure 1E:
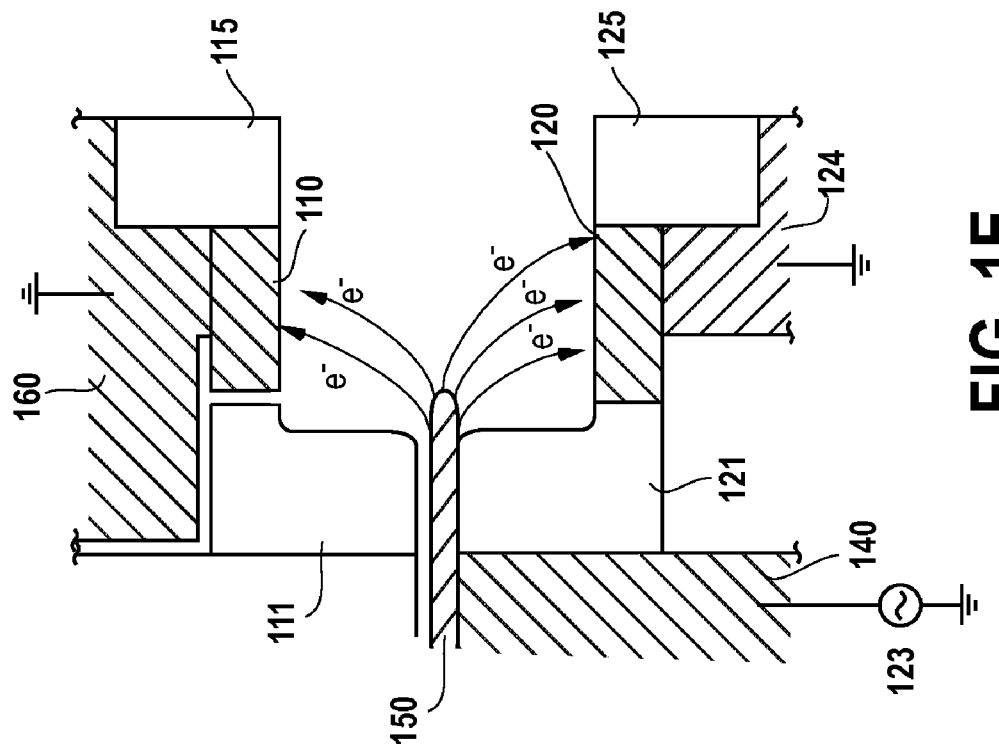
FIG. 1E shows the bevel edge cleaning plasma generated by RF powered substrate and grounded top edge electrode and grounded bottom edge electrode, in accordance with one embodiment of the present invention.

Several exemplary embodiments for improved structures and mechanisms to remove etch byproducts, dielectric films and metal films near the substrate bevel edge, and chamber interior to avoid polymer byproduct and film accumulation and to improve process yield. It will be apparent to those skilled in the art that the present invention may be practiced without some or all of the specific details set forth herein.

FIG. 1A shows a chamber 100 for cleaning a bevel edge, in accordance with one embodiment of the present invention. Chamber 100 has a substrate support 140 with a substrate 150 on top. The substrate support 140 is an electrode, which is powered by a RF (radio frequency) power source 123. The substrate support can also be called lower electrode 140. In another embodiment, the substrate support 140 is an electrostatic chuck. Opposing the lower electrode 140 is an insulator plate 163. In one embodiment, there is a gas feed 161 coupled to the center of the insulator plate 163 to provide process gas. The substrate support can also be RF powered or grounded. The substrate 150 has a bevel edge 117 that includes a top and a bottom surface of the edge of the substrate, as shown in region B of FIG. 1A and enlarged region B in FIG. 1B. In FIG. 1B, bevel edge 117 is highlighted as a bold solid line and curve.

Surrounding the edge of lower electrode 140, there is a bottom edge electrode 120, made of conductive materials, such as aluminum (Al), anodized aluminum, silicon (Si), and silicon carbide (SiC). If the material is aluminum or anodized aluminum, the aluminum can be coated with a layer of yttrium oxide ($Y_2O_3$) to protect aluminum from being corroded by the etching chemistry. Corroded aluminum can flake off and cause particle problems. Between the lower electrode 140 and the bottom edge electrode 120, there is a bottom dielectric ring 121 electrically separating the lower electrode 140 and the bottom edge electrode 120. In one embodiment, substrate 150 is not in contact with the bottom edge electrode 120. Beyond the bottom edge electrode 120, there is another bottom insulating ring 125, which extends the surface of the bottom edge electrode 120 facing substrate 150. The bottom dielectric ring 121 and the bottom insulating ring 125 can be made of insulating materials, such as ceramic or alumina ($Al_2O_3$). The bottom edge electrode 120 is electrically and physically coupled to a lower focus ring 124.

The bottom edge electrode and the bottom electrode are electrically coupled to one another through an RF circuit 155 tunable to adjust the amount of an RF current going between the substrate 150 disposed on the bottom electrode 140, the bottom edge electrode 120 and a top edge electrode 110. In one embodiment, the lower focus ring 124 is electrically coupled to the RF power supply 123 for the lower electrode 140. The lower focus ring 124 is electrically and physically separated from the lower electrode 140 by an isolation ring 122. The isolation ring 122 is made of a dielectric material, such as ceramic or alumina. The lower focus ring 124 is grounded. Between the ground and the focus ring 124, there is a resistor 152. Alternatively, the resistor 152 is replaced with a resistor 154 coupled in parallel to a capacitor 153, as shown in FIG. 1A-1, in accordance with another embodiment of the present invention. Between the lower focus ring 124 and the power supply of the lower electrode 140, there is a tunable capacitor 151. The tunable capacitor 151 and the resistor 152 constitute the RF circuit, in one embodiment. Alternatively, the tunable capacitor 151, and the resistor 154 with capacitor 153 constitute the RF circuit.

The bottom electrode 140 is coupled to a moving mechanism 130 that enables the bottom electrode assembly to move up or down. The bottom electrode assembly includes the bottom electrode 140, the bottom edge electrode 120, the bottom dielectric ring 121, the bottom insulating ring 125, and the isolation ring 122.

Surrounding the insulator plate 163 is the top edge electrode 110, opposing the lower edge electrode 120. The top edge electrode 110 can be made of conductive materials, such as aluminum (Al), anodized aluminum, silicon (Si), and silicon carbide (SiC). In one embodiment, between the top edge electrode 110 and the insulator plate 163 is a top dielectric ring 111. Beyond the top edge electrode 110, there is top insulating ring 115, which extends the surface of the top edge electrode 110 facing substrate 150. The top edge electrode 110 is electrically and physically coupled to a top electrode 160, which is grounded. Between the top electrode 160 and the insulator plate 163 there are a plurality of channels 164 that allow processing gas to be flow to openings 165 between the top edge electrode 110 and the top dielectric ring 111. The plurality of channels 164 extend beyond the top electrode 160 and are between the top dielectric ring 111 and top electrode 160, and between the top edge electrode 110 and the top dielectric ring 111. A portion of channels 165 near the openings 165 is in circle A, which is expanded in FIG. 1C. The process gas can be fed to be in the bevel edge region through the openings 165, or through the top center gas feed 161 and the space between the insulator plate 163 and substrate 150. In addition, the chamber walls 170 are grounded. The top electrode 160, the top edge electrode 110, the top dielectric ring 111, the top insulating ring 115, and the isolation ring 112, and the insulator plate 163 form a top electrode assembly.

Figure 1D:
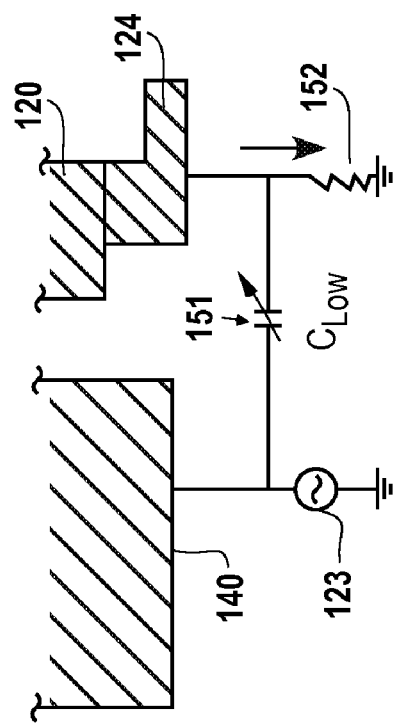
FIG. 1D shows the bottom edge electrode being grounded when the tunable capacitor is tuned to a low value, in accordance with one embodiment of the present invention.

During bevel edge cleaning, the top edge electrode 110 is grounded through the top electrode 160. The bottom electrode 140 is powered by the RF source 123. As described above, the bottom edge electrode 120 is electrically coupled to the lower focus ring 124, which is coupled to a resistor 152 and a tunable capacitor 151. As described above, the resistor 152 can be replaced with a resistor 154 coupled in parallel to a capacitor 153, as shown in FIG. 1A-1. In one embodiment, the resistance of resistor 152 is between about 10 ohms and about 100,000 ohms In one embodiment, the resistance of resistor 154 is between about 10 ohms and about 100,000 ohms, and the capacitance of capacitor 153 is between about 10 pF to about 1000 pF. If the capacitor 151 is tuned to be at a low value (low capacitance), such as between about 10 Pico farad (pF) and about 100 pF, the bottom edge electrode is grounded, as shown in FIG. 1D. The bottom electrode 140 provides RF power to the wafer 150 to generate plasma. The space between the substrate 150 and the insulating plate 163 is kept very small, such as less than 1.0 mm, so that no plasma would generate between on the substrate surface that is beneath the insulating plate 160. A plasma can be generated near the edge of the substrate 150 to clean the bevel edge, with the grounded bottom edge electrode 120 and the grounded top edge electrode 110 providing returning electrical paths, as shown in FIG. 1E.

In one embodiment, the RF circuit is tuned to a resonant frequency close to a resonant frequency of the RF power supply to allow part of a RF power generated by the RF power supply to go to the bottom edge electrode. The cleaning plasma generated is powered by the RF power supplied to the substrate disposed on the bottom electrode and to the bottom edge electrode through the RF circuit and having the top edge electrode acting as a ground return.

In another embodiment, the RF circuit is tuned to a resonant frequency far from a resonant frequency of the RF power supply to make the bottom edge electrode become close to being grounded. The cleaning plasma generated is powered by the RF power supplied to the substrate disposed on the bottom electrode and being grounded both to the top edge electrode and to the bottom edge electrode.

Figure 1G:
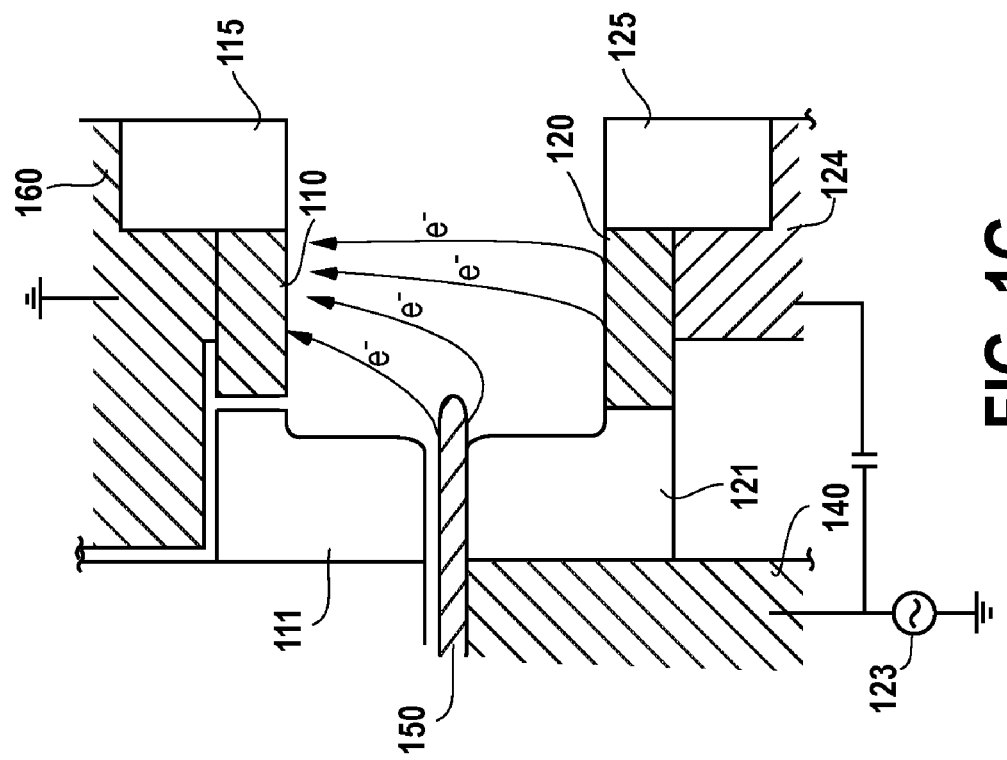
FIG. 1G shows the bevel edge cleaning plasma generated by RF powered substrate and bottom edge electrode and grounded top edge electrode, in accordance with one embodiment of the present invention.
Figure 1F:
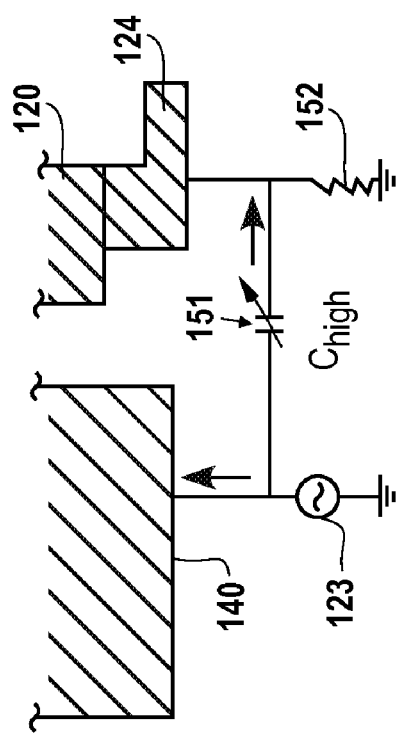
FIG. 1F shows that part of the RF power supplied to the bottom electrode is supplied to the bottom edge electrode when the tunable capacitor is tuned to a high value, in accordance with one embodiment of the present invention.

If the capacitor 151 is tuned to be at a high value (high capacitance), such as between about 100 pF to about 10,000 pF, part of the RF power from the RF power source 123 is supplied to the lower edge electrode, as shown in FIG. 1F, although at a different phase, usually less than 90 degrees apart from the main RF power. As describe above, the resistor 152 can be replaced with a resistor 154 coupled in parallel to a capacitor 153, as shown in FIG. 1A-1. In this case, both bottom edge electrode 120 and the wafer 150, through the bottom electrode, supply RF power to generate plasma. The top edge electrode 110 provide returning path for the plasma, as shown in FIG. 1G. The amount of RF power provided by the bottom edge electrode 120 can be tuned by adjusting the tunable capacitor 151. The capacitor 151 and resistor 152 enable a new process knob to the bevel edge cleaning chamber.

During a substrate bevel edge cleaning process, the RF power source 123 supplies RF power at a frequency between about 2 MHz to about 13 MHz and a power between about 100 watts to about 2000 watts to generate a cleaning plasma. The cleaning plasma is configured to be confined by the top dielectric ring 111, top edge electrode 110, the top insulating ring 115, the bottom dielectric ring 121, the bottom edge electrode 120, and the bottom insulating ring 125. The cleaning gas(es) can be supplied through the gas feed 161 near the center of the insulator plate 163 or gas channels 164 to openings 165. The cleaning gas can also be supplied through both the gas feed 161 and the gas channels 164. For example, one type of gas is supplied through the gas feed 161 and another type is supplied through gas channels 164. In another example, a percentage of the total process gas mixture is supplied through gas feed 161 and the remaining gas mixture is supplied through gas channels 164. Alternatively, the cleaning gas(es) can also be supplied through gas feed(s) disposed in other parts of the process chamber 100.

To clean etch byproduct polymers, cleaning gases can include an oxygen-containing gas, such as $O_2$. Some amount, such as <10%, of a fluorine-containing gas, such as $CF_4$, $SF_6$, or $C_2F_6$, can also be added to clean the polymer in one embodiment. It should be appreciated that nitrogen-containing gas, such as $N_2$, can also be included in the gas mixture. The nitrogen-containing gas assists dissociation of the oxygen-containing gas. An inert gas, such as Ar or He, can also be added to dilute the gas and/or to maintain the plasma. To clean a dielectric film(s), such as SiN or $SiO_2$, at the bevel edge 117, a fluorine-containing gas, such as $CF_4$, $SF_6$, or a combination of both gases, can be used. An inert gas, such as Ar or He, can also be used to dilute the fluorine-containing gas and/or to maintain the cleaning plasma. To clean a metal film(s), such as Al or Cu, at the bevel edge 117, a chlorine-containing gas, such as $Cl_2$, or $BCl_3$, or a combination of both gases, can be used. An inert gas, such as Ar or He, can also be used to dilute the chlorine-containing gas and/or to maintain the plasma to clean the metal film(s).

In one embodiment, the space between the top edge electrode 110 and the bottom edge electrode 120, $D_{EE}$, is relatively small compared to the distance to nearest ground ($D_W$) of the bottom edge electrode 120 or top edge electrode 110. In one embodiment, the space $D_{EE}$ is between about 0.5 cm to about 2.5 cm. In one embodiment, the ratio of $D_W/D_{EE}$ is greater than about 4:1, which ensures plasma confinement. In one embodiment, $D_W$ is the distance from the bottom edge electrode 120 to the near grounded chamber wall 170. The chamber pressure is kept between about 100 mTorr to about 2 Torr during the bevel edge cleaning process. In one embodiment, the spacing between the insulator plate 163 and substrate 150, $D_S$, is less than about 1.0 mm to ensure no plasma is formed between the top electrode 160 and the substrate 150 during the bevel edge cleaning process. In another embodiment, Ds is less than 0.4 mm.

The plasma generated in FIGS. 1E and 1G is a capacitively coupled cleaning plasma. Alternatively, the bottom edge electrode 120 can be replaced with an inductive coil buried in a dielectric material. In this embodiment, the capacitor 151 is set at a high value and RF power is supplied to the inductive coil. The plasma generated to clean the bevel edge is a mixture of capacitively coupled plasma (generated by the bottom electrode 140) and inductively coupled plasma (generated by the bottom edge electrode 120). Inductive coupled plasma generally has a higher density than capacitively coupled plasma and can efficiently clean the bevel edge.

The plasma generated near the substrate edge and between the top edge electrode 110 and the bottom edge electrode 120 cleans the substrate bevel edge of the substrate. The cleaning helps reduce the build-up of polymer at the substrate bevel edge, which reduces or eliminates the possibility of particle defects impacting device yield.

Figure 2A:
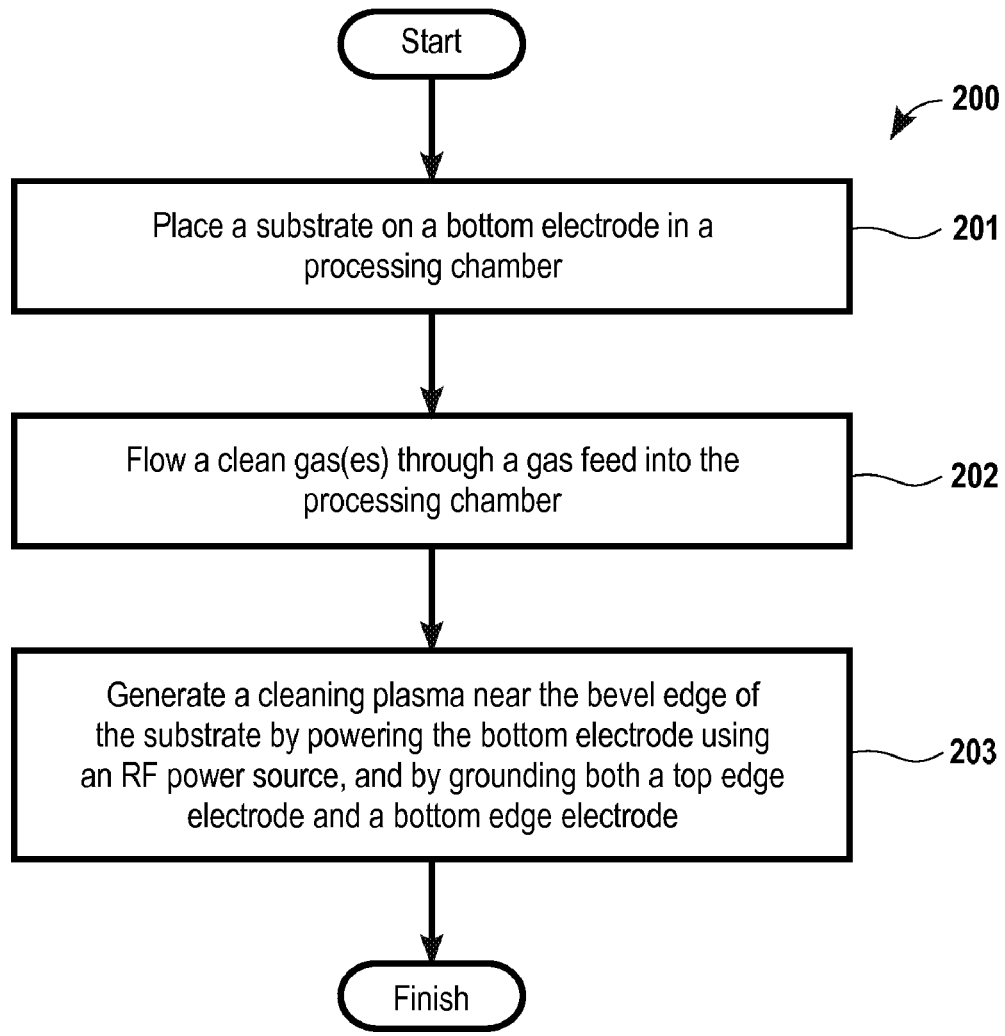
FIG. 2A shows a process flow of generating a bevel edge cleaning plasma, in accordance with one embodiment of the present invention.

FIG. 2A shows a process flow 200 for cleaning the bevel edge of the substrate, in accordance with one embodiment of the present invention. The process starts at step 201 by placing a substrate on a bottom electrode in a processing chamber. The process is followed by flowing a cleaning gas(es) through a gas feed into the processing chamber at step 202. The gas feed can supply the cleaning gas to the center of the processing chamber or to the edge of the processing chamber. At step 203, a cleaning plasma is then generated near the bevel edge of the substrate by powering the bottom electrode using a RF power source and by grounding a top edge electrode and a bottom edge electrode. For this embodiment, the tunable capacitor between the bottom edge electrode and bottom electrode is set at a low value.

Figure 2B:
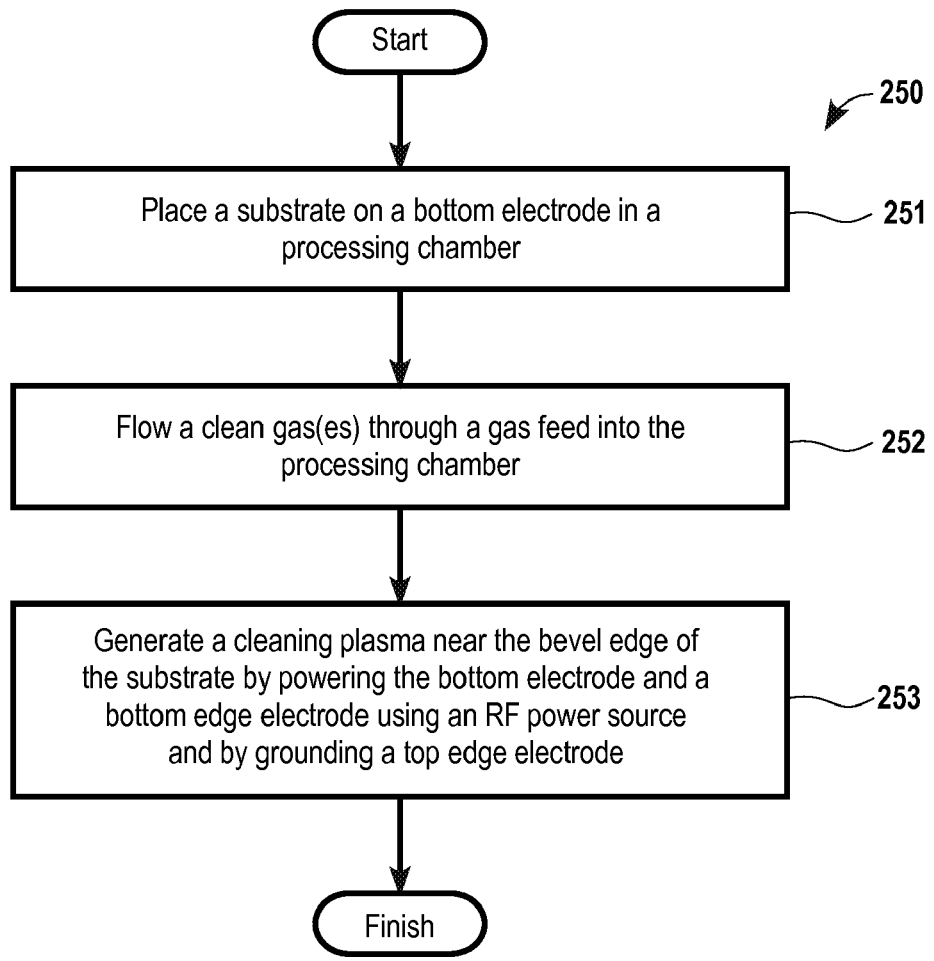
FIG. 2B shows another process flow of generating a bevel edge cleaning plasma, in accordance with one embodiment of the present invention.

FIG. 2B shows another process flow 250 for cleaning the bevel edge of the substrate, in accordance with one embodiment of the present invention. The process starts at step 251 by placing a substrate on a bottom electrode in a processing chamber. The process is followed by flowing a cleaning gas (es) through a gas feed into the processing chamber at step 252. The gas feed can supply the cleaning gas to the center of wafer or to the edge of the wafer. At step 253, a cleaning plasma is then generated near the bevel edge of the substrate by powering the bottom electrode and a bottom edge electrode using a RF power source and by grounding a top edge electrode. For this embodiment, the tunable capacitor between the bottom electrode and the bottom edge electrode is set at a high value.

As described above in FIG. 1E, the RF power supply 123 supplies a RF power that is transmitted through the substrate 150 to generate a cleaning plasma with the grounded top edge electrode 110 and bottom edge electrode 120. The cleaning plasma is around the bevel edge and cleans the bevel edge. Due to direct RF through the substrate, the substrate surface near the bevel edge has a DC potential. The DC potential on the substrate results in higher ion energy and a higher etch rate at the bevel edge. Similarly, the embodiment shown in FIG. 1G, with RF power supplied to the substrate 150 and the bottom edge electrode 120 and grounded top edge electrode 110, also has a DC potential on the substrate surface near the bevel edge.

The configuration shown in FIG. 1A can also be used generate plasma to clean the chamber interior. During the chamber interior cleaning, the substrate 150 is removed from the process chamber 100. Therefore, the process can also be called waferless autoclean (WAC). In one embodiment, the pressure in the process chamber is kept below 500 mTorr. The lower chamber pressure allows the cleaning plasma to diffuse through out the chamber interior. For waferless autoclean (or called chamber interior clean), the distance requirement between the insulator plate 163 and substrate 150, $D_S$, to be less than about 1.0 mm, is no longer needed. Similarly, the space requirement between the top edge electrode 110 and the bottom edge electrode 120, $D_{EE}$, of between about 0.5 cm to about 2.5 cm is also not needed. Chamber interior leaning plasma does not need to be confined between the top edge electrode 110 and bottom edge electrode 120 or between the top insulating ring 115 and bottom insulating ring 125. The cleaning plasma needs to diffuse through out the chamber interior to clean thoroughly.

During WAC (or chamber interior clean), the RF power is supplied to the bottom electrode 140 and the tunable capacitor 151 is tuned to a low value, in one embodiment. Both the top edge electrode 110 and the bottom edge electrode 120 are grounded. In another embodiment, the tunable capacitor can be set at a high value to allow part of the RF power from RF source 123 to go to the bottom edge electrode to generate cleaning plasma with higher density near the edge of the process chamber to allow cleaning of chamber walls or components near chamber walls more efficiently.

As described above, to clean the bevel edge, the frequency of RF power used is between about 2 MHz to about 60 MHz, or a mixture of frequencies. To clean the chamber interior, the frequency of RF power is between about 2 MHz to about 60 MHz, or a mixture of frequencies. The plasma used to clean chamber interior normally has a higher plasma density than the plasma used to clean bevel edge; therefore, the RF power used to clean chamber interior has higher frequency(ies) than the RF power used to clean bevel edge. In one embodiment, the RF source 123 is a dual frequency power generator.

Different chemistries can be applied to perform WAC, depending on the residues accumulated in the chamber interior. The accumulated residue can be photoresist, dielectric materials, such as oxide and nitride, or conductive materials, such as tantalum, tantalum nitride, aluminum, silicon, or copper. The materials mentioned here are only examples. The inventive concept can also be applied to other applicable dielectric materials or conductive materials.

Figure 2C:
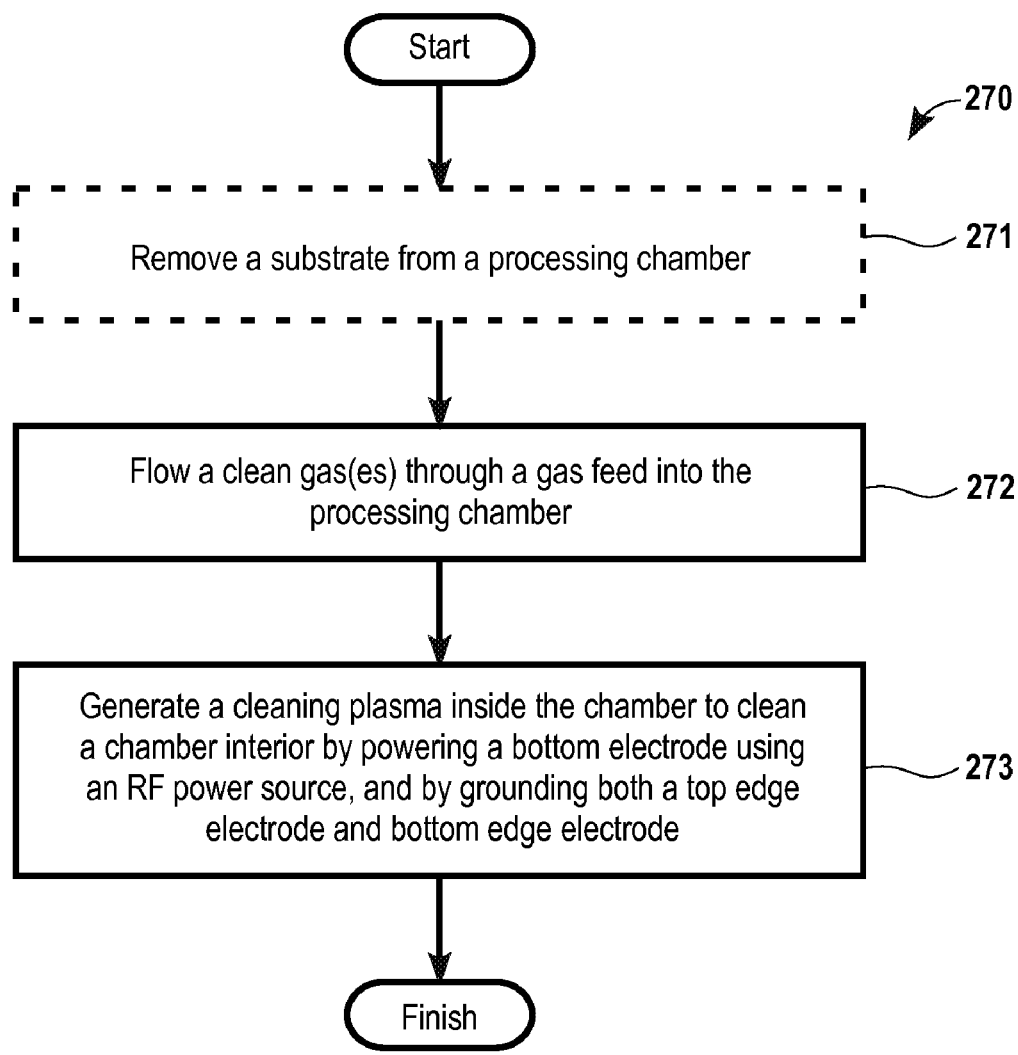
FIG. 2C shows a process flow of generating a chamber interior cleaning plasma, in accordance with one embodiment of the present invention.

FIG. 2C shows a process flow 270 for cleaning the bevel edge of the substrate, in accordance with one embodiment of the present invention. The process starts at an optional step 271 by removing a substrate from a processing chamber, assuming there is a substrate in the processing chamber. If there is not substrate (or wafer) in the processing chamber, a chamber interior clean (or WAC) can still be initiated. Under this circumstance, step 271 is not needed. The process is followed by flowing a cleaning gas(es) through a gas feed into the processing chamber at step 272. The gas feed can supply the cleaning gas to the center of the processing chamber or to the edge of the processing chamber. At step 273, a cleaning plasma is then generated inside the processing chamber by powering the bottom electrode using a RF power source and by grounding a top edge electrode and a bottom edge electrode. For this embodiment, the tunable capacitor between the bottom edge electrode and bottom electrode is set at a low value.

Figure 2D:
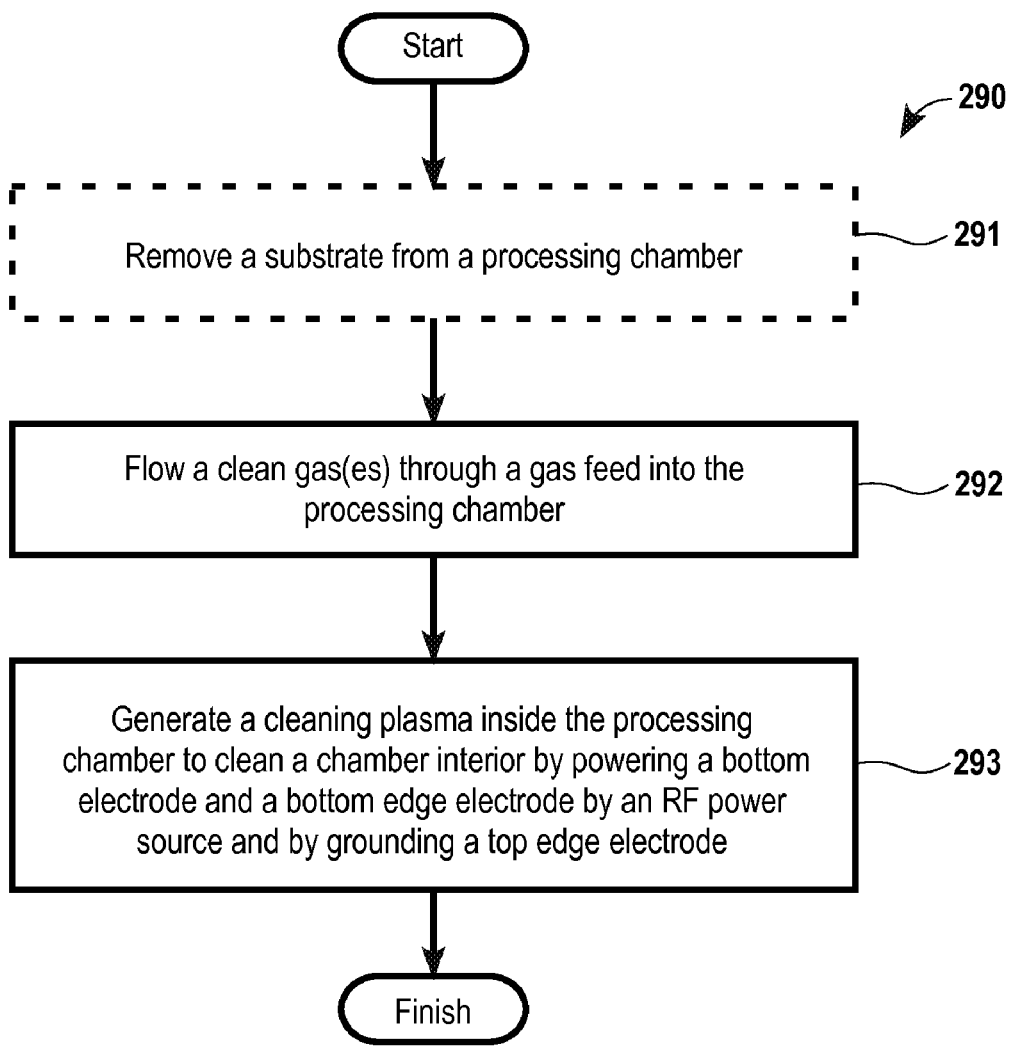
FIG. 2D shows another process flow of generating a chamber interior cleaning plasma, in accordance with one embodiment of the present invention.

FIG. 2D shows another process flow 290 for cleaning the bevel edge of the substrate, in accordance with one embodiment of the present invention. The process starts at an optional step 291 by removing a substrate from a processing chamber, if there is a substrate in the processing chamber. If there is not substrate (or wafer) in the processing chamber, a chamber interior clean (or WAC) can still be initiated. Under this circumstance, step 291 is not needed. The process is followed by flowing a cleaning gas(es) through a gas feed into the processing chamber at step 292. The gas feed can supply the cleaning gas to the center of wafer or to the edge of the wafer. At step 293, a cleaning plasma is then generated in the processing chamber by powering the bottom electrode and a bottom edge electrode using a RF power source and by grounding a top edge electrode. For this embodiment, the tunable capacitor between the bottom electrode and the bottom edge electrode is set at a high value.

Figure 3A:
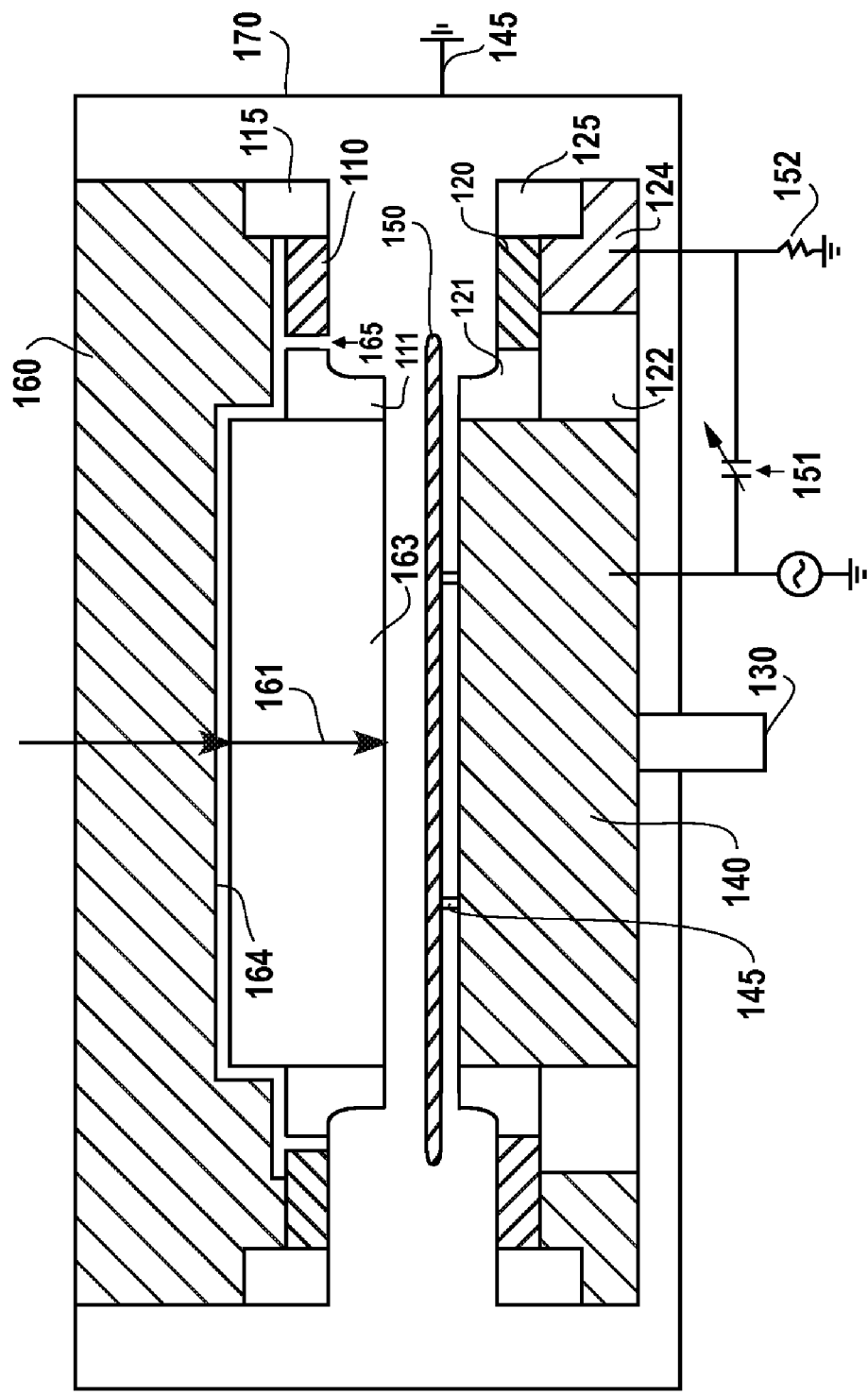
FIG. 3A shows a schematic diagram of a substrate etching system with a pair of top and bottom edge electrodes, in accordance with one embodiment of the present invention.

The embodiments described in FIGS. 1A, and 1D-1G have wafer 150 resting on the bottom electrode 140. Alternatively, there could be lift pins 145 in the bottom electrode that can lift up the substrate 150 away from the bottom electrode 140, as shown in FIG. 3A. In one embodiment, the distance between the substrate 150 and the bottom electrode 140 is between about 0.05 mm to about 0.95 mm. The distance between the substrate 150 and the insulator plate 163 is kept small, e.g. less than about 1.0 mm, to prevent plasma being formed between the surface of substrate 150 and the insulator plate 163. In a preferred embodiment, the distance is kept below 0.4 mm. Since the substrate 150 is no longer in contact with the bottom electrode 140, RF power does not go through the substrate 150 to generate plasma. The RF circuit is tuned to allow part to the RF power to go to the bottom edge electrode 120 to generate plasma near the bevel edge. In one embodiment, the tunable capacitor is set at a high value to allow part to the RF power to go to the bottom edge electrode 120 to generate plasma near the bevel edge.

Figure 3B:
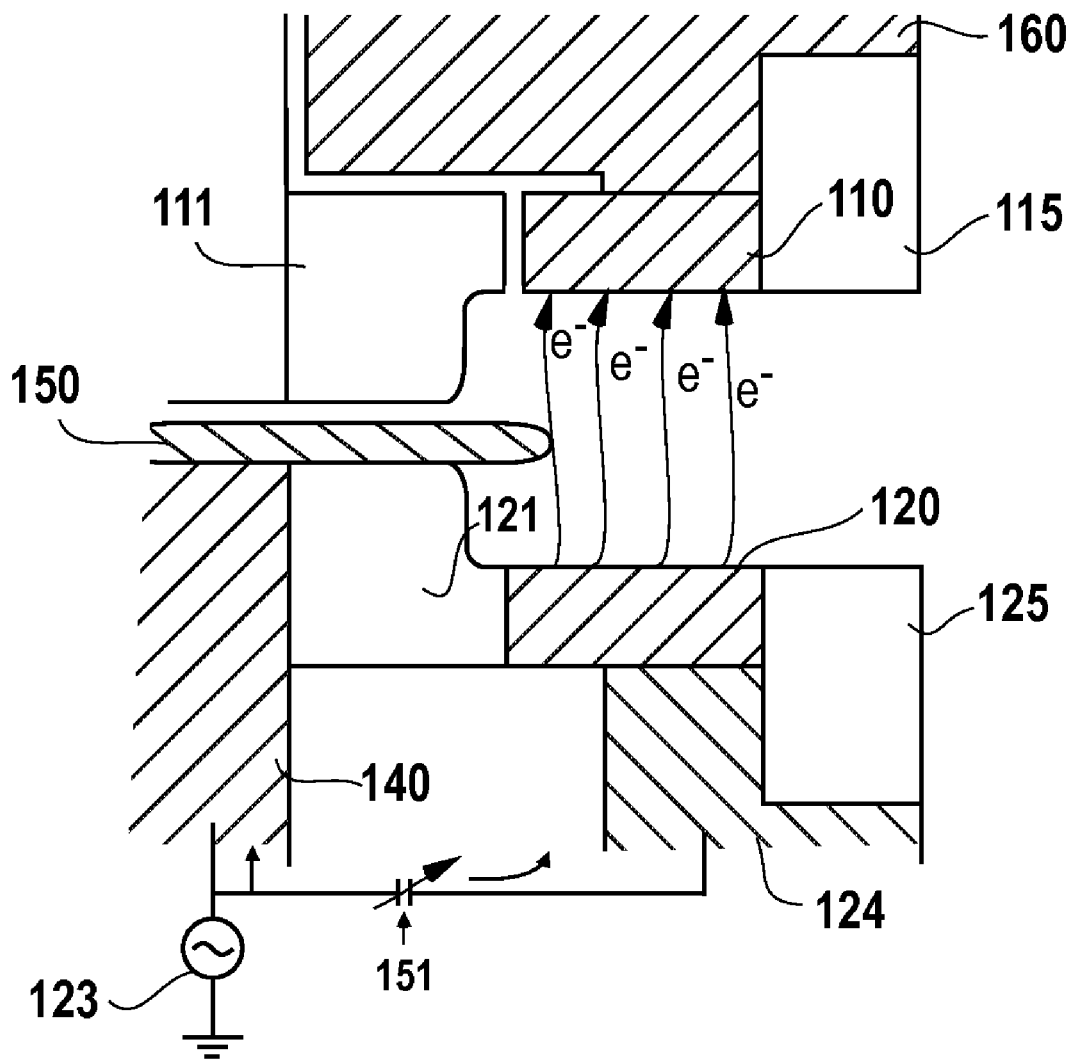
FIG. 3B shows a bevel edge cleaning plasma generated by RF powered bottom electrode and bottom edge electrode and grounded top edge electrode, in accordance with one embodiment of the present invention.

FIG. 3B show the electron flows of the cleaning plasma, in accordance with one embodiment of the present invention. Since the gap between the bottom electrode 140 and bottom of wafer is small (<about 1.0 mm) no plasma is formed on the substrate backside. The plasma generated is in the area between the bottom edge electrode 120 and the top edge electrode 110.

Figure 4C:
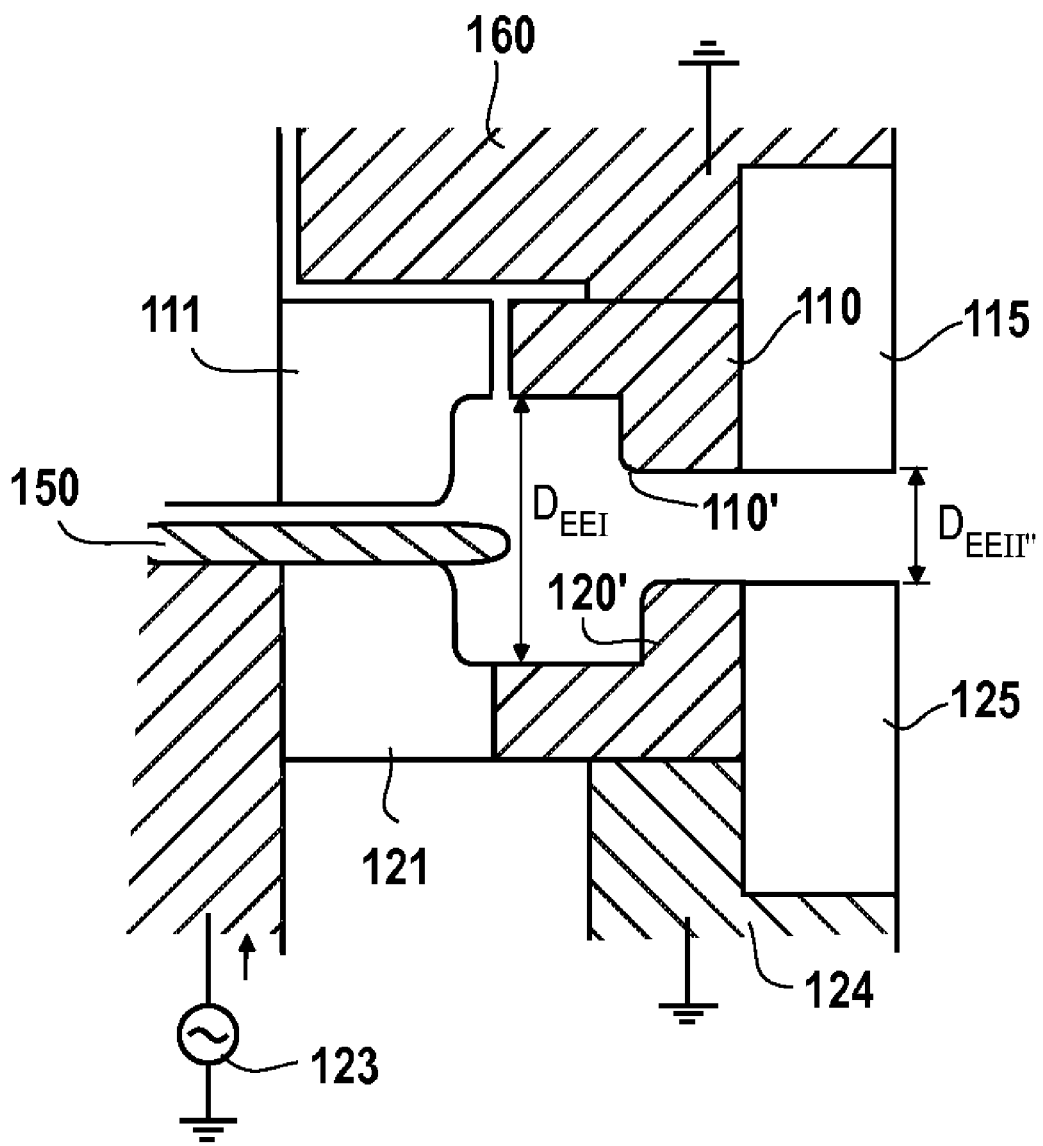
FIG. 4C shows a part of a processing chamber to clean bevel edge cleaning similar to FIG. 1E, in accordance with yet another embodiment of the present invention.

FIG. 4A shows another embodiment of bottom edge electrode 120', where part of bottom edge electrode 120' and the bottom insulator ring 125 are designed to be closer to the top edge electrode 110 and the top insulator ring 115. A plasma can be generated near the edge of the substrate 150 to clean the bevel edge, with the grounded bottom edge electrode 120 and the grounded top edge electrode 110 providing returning electrical paths similar to the edge electrodes shown in FIG. 1E. However, the plasma confinement would be better in this design. The distance $D_{EEII}$ between the top edge electrode 110 and the tall part of the bottom edge electrode 120' is smaller than the distance $D_{EEI}$ between the top edge electrode 110 and the short part of the bottom edge electrode 120'. As described above, smaller $D_{EEII}$ helps to confine plasma. In one embodiment, the ratio between $D_{EEI}$ to $D_{EEII}$ is about 2:1. Alternatively, the bottom electrode 120 has a flat top surface while the top edge electrode 110' is "L" shaped, as shown in FIG. 4B, to make the distance $D_{EEH}'$ between the top edge electrode 110' and the bottom edge electrode 120 small to better confine plasma. In yet another embodiment, both the top edge electrode 110' and the bottom edge electrode 120' are "L" shaped, as shown in FIG. 4C to make the distance $D_{EEH}''$ between the top edge electrode 110' and the bottom edge electrode 120' small to better confine plasma.

The apparatus and methods for cleaning of bevel edge, and chamber interior reduce undesirable build-up of etch by-products and deposited films on the substrate or chamber interior and enhance the device yields.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma processing chamber configured for cleaning a bevel edge of a substrate, comprising:
    a bottom electrode having a bottom electrode surface for supporting the substrate when present, wherein the bottom electrode is coupled to a radio frequency (RF) power supply;
    a top edge electrode surrounding an insulating plate, the insulator plate opposing the bottom electrode, the top edge electrode being electrically grounded and separated from the insulator plate by a top dielectric ring, the top edge electrode having an L shape that is down-facing, wherein a vertical portion of the L shape is oriented horizontal, and the base portion of the L shape is oriented to face the bottom edge electrode;
    a bottom edge electrode, being electrically grounded, surrounds the bottom electrode and is separated from the bottom electrode by a bottom dielectric ring, the bottom edge electrode is oriented to oppose the top edge electrode;
    wherein the L shape defines a first separation and a second separation between the top and bottom edge electrodes,
        the first separation established by the vertical portion of the L shape that is oriented horizontal and is adjacent to the top and bottom dielectric rings, and
        the second separation is established by the base portion of the L shape that is spaced radially outward from the top and bottom dielectric rings;
        the first separation is greater than the second separation.

2. The plasma processing chamber as recited in claim 1, wherein the bottom edge electrode is substantially flat and faces the L shape of the top edge electrode.

3. The plasma processing chamber as recited in claim 1, wherein the first separation defines a volume near an edge of the substrate when present.

4. The plasma processing chamber as recited in claim 1, wherein the first separation to the second separation has a ratio of about 2:1.

5. The plasma processing chamber as recited in claim 4, wherein a plasma is partially confined by the ratio, when the plasma processing chamber is active to clean the bevel edge of the substrate, when the substrate is present.

6. The plasma processing chamber as recited in claim 1, further comprising:

a top insulator ring surrounding the top edge electrode; and
    a bottom insulator ring surrounding the bottom edge electrode.

7. The plasma processing chamber as recited in claim 6, wherein each of the top and bottom edge electrodes have opposing electrode surfaces that are spaced apart from the bottom electrode surface.

8. The plasma processing chamber of claim 1, wherein the top dielectric ring and the bottom dielectric ring substantially face each other.

9. The plasma processing chamber of claim 1, further comprising:
    a gas feed embedded in the insulator plate to provide a process gas to clean the bevel edge of the substrate.

10. The plasma processing chamber of claim 1, further comprising:
    a plurality of gas channels embedded in a top assembly, which comprises the insulator plate and top edge electrode, to supply process gas near the edge of the substrate, when present, to clean the bevel edge of the substrate.

11. The plasma processing chamber of claim 1, wherein the RF power supply is set to between about 2 MHz and about 60 MHz.

12. A plasma processing chamber configured for cleaning a bevel edge of a substrate, comprising:
    a bottom electrode having a bottom electrode surface for supporting the substrate when present, wherein the bottom electrode is coupled to a radio frequency (RF) power supply;
    a top edge electrode surrounding an insulating plate, the insulator plate opposing the bottom electrode, the top edge electrode being electrically grounded and separated from the insulator plate by a top dielectric ring, the top edge electrode having an L shape that is down-facing, wherein a vertical portion of the L shape is oriented horizontal, and the base portion of the L shape is oriented to face the bottom edge electrode, wherein a distance between the insulator plate and the surface of the substrate facing the insulator plate, when the substrate is present, is less than about 1.0 mm;
    a bottom edge electrode, being electrically grounded, surrounds the bottom electrode and is separated from the bottom electrode by a bottom dielectric ring, the bottom edge electrode is oriented to oppose the top edge electrode;
    wherein the L shape defines a first separation and a second separation between the top and bottom edge electrodes,
        the first separation established by the vertical portion of the L shape that is oriented horizontal and is adjacent to the top and bottom dielectric rings, and
        the second separation is established by the base portion of the L shape that is spaced radially outward from the top and bottom dielectric rings;
        the first separation is greater than the second separation;
    a top insulator ring surrounding the top edge electrode; and
    a bottom insulator ring surrounding the bottom edge electrode.

13. The plasma processing chamber of claim 12, wherein the top insulator ring extend to a distance about equal to the base portion of the L shape and the bottom insulator ring extends to a distance that is about equal to the bottom electrode chamber.

* * * * *